United States Patent [19]
Farnworth

[11] Patent Number: 5,982,185
[45] Date of Patent: *Nov. 9, 1999

[54] DIRECT CONNECT CARRIER FOR TESTING SEMICONDUCTOR DICE AND METHOD OF FABRICATION

[75] Inventor: Warren M. Farnworth, Nampa, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/673,930

[22] Filed: Jul. 1, 1996

[51] Int. Cl.⁶ ........................................ G01R 31/02
[52] U.S. Cl. .................. 324/755; 324/537; 324/754; 324/755; 324/555; 324/158.1; 324/765
[58] Field of Search .................... 324/537, 754, 324/755, 555, 158.1, 765

[56] References Cited

U.S. PATENT DOCUMENTS

| | | | |
|---|---|---|---|
| 4,717,347 | 1/1988 | Babow et al. | 439/72 |
| 4,891,687 | 1/1990 | Mallik et al. | 357/70 |
| 4,899,107 | 2/1990 | Corbett et al. | 324/158 F |
| 4,899,921 | 2/1990 | Bendat et al. | 228/105 |
| 4,950,980 | 8/1990 | Pfaff | 439/296 |
| 5,006,792 | 4/1991 | Malhi et al. | 324/158 F |
| 5,012,323 | 4/1991 | Farnworth | 357/75 |
| 5,073,117 | 12/1991 | Malhi et al. | 439/71 |
| 5,088,190 | 2/1992 | Malhi et al. | 29/843 |
| 5,107,328 | 4/1992 | Kinsman et al. | 357/74 |
| 5,140,404 | 8/1992 | Fogal et al. | 357/70 |
| 5,155,067 | 10/1992 | Wood et al. | 437/209 |
| 5,180,974 | 1/1993 | Mitchell et al. | 324/158 F |
| 5,214,845 | 6/1993 | King et al. | 29/841 |
| 5,272,590 | 12/1993 | Hernandez | 361/306.2 |
| 5,283,717 | 2/1994 | Hundt | 361/813 |
| 5,302,891 | 4/1994 | Wood et al. | 324/158 F |
| 5,367,253 | 11/1994 | Wood et al. | 324/158.1 |
| 5,399,903 | 3/1995 | Rostoker et al. | 257/666 |
| 5,408,190 | 4/1995 | Wood et al. | 324/765 |
| 5,422,435 | 6/1995 | Takiar et al. | 174/52.4 |
| 5,424,652 | 6/1995 | Hembree et al. | 324/765 |
| 5,440,240 | 8/1995 | Wood et al. | 324/765 |
| 5,451,165 | 9/1995 | Cearley-Cabbiness et al. | 439/71 |

(List continued on next page.)

OTHER PUBLICATIONS

Yamamoto, Yasuhikio et al., "Evaluation of New Micro–Connection System Using Microbumps", Nitto Denko Corp., Technical Paper, ISHM '93 Proceedings, pp. 370–378.

Miyake, Kiyoshi et al., "Connectivity Analysis of New 'Known Good Die' Connection System Using Microbumps", Technical Report, Nitto Denko Corp., pp. 1–7, 1994.

Zilber, G., "Slimcase—A Thin Chip Size, Integrated Circuit Package", Advertising Brochure, pp. 2–8, 1996.

Primary Examiner—Michael Brock
Attorney, Agent, or Firm—Stephen A. Gratton

[57] ABSTRACT

A carrier and system for testing a semiconductor die and a method for fabricating the carrier are provided. The carrier comprises a base and an interconnect attached to the base adapted to establish temporary electrical communication with the die. The interconnect includes contact members adapted to make temporary electrical connections with test pads on the die. In addition, the interconnect includes conductors in electrical communication with the contact members. The conductors include input/output pads configured for direct electrical connection to an electrical connector of a testing apparatus such as socket on a burn-in board. In a first embodiment of the interconnect, the contact members are formed on a silicon substrate and include penetrating projections. In an alternate embodiment of the interconnect, the contact members are formed as microbumps mounted on flexible tape. The contact members and conductors can be formed as a single layer of material or as a bi-metal stack including a conductive layer formed of a highly conductive metal such as aluminum, and a contact layer formed of an inert wear resistant metal such as palladium, tungsten or platinum.

24 Claims, 4 Drawing Sheets

U.S. PATENT DOCUMENTS

| | | | |
|---|---|---|---|
| 5,468,992 | 11/1995 | Kanekawa et al. | 257/676 |
| 5,468,999 | 11/1995 | Lin et al. | 257/784 |
| 5,483,174 | 1/1996 | Hembree et al. | 324/765 |
| 5,483,741 | 1/1996 | Akram et al. | 29/846 |
| 5,495,179 | 2/1996 | Wood et al. | 324/755 |
| 5,497,031 | 3/1996 | Kozono | 257/700 |
| 5,498,900 | 3/1996 | Dunaway et al. | 257/659 |
| 5,519,332 | 5/1996 | Wood et al. | 324/755 |
| 5,557,212 | 9/1996 | Isaac et al. | 324/755 |
| 5,607,818 | 3/1997 | Akram et al. | 430/311 |
| 5,633,122 | 5/1997 | Tuttle | 324/765 |
| 5,634,267 | 6/1997 | Farnworth et al. | 29/840 |
| 5,678,301 | 10/1997 | Gochnour et al. | 29/827 |
| 5,686,317 | 11/1997 | Akram et al. | 437/8 |
| 5,691,649 | 11/1997 | Farnhworth et al. | 324/755 |
| 5,721,496 | 2/1998 | Farnworth et al. | 324/765 |
| 5,731,709 | 3/1998 | Pastore et al. | |
| 5,742,170 | 4/1998 | Isaac et al. | 324/755 |
| 5,781,022 | 7/1998 | Wood et al. | 324/757 |
| 5,783,461 | 7/1998 | Hembree | 438/17 |
| 5,789,271 | 8/1998 | Akram | 438/18 |
| 5,815,000 | 9/1998 | Farnworth et al. | 324/755 |
| 5,825,165 | 10/1998 | Hembree et al. | 324/765 |
| 5,844,418 | 12/1998 | Wood et al. | 324/755 |
| 5,878,485 | 3/1999 | Wood et al. | | ized test carriers that hold a single die for

DIRECT CONNECT CARRIER FOR TESTING SEMICONDUCTOR DICE AND METHOD OF FABRICATION

FIELD OF THE INVENTION

This invention relates generally to semiconductor manufacture and more particularly to an improved carrier and system for testing semiconductor dice including bare dice or dice encapsulated in chip scale packages.

BACKGROUND OF THE INVENTION

Recently, semiconductor dice have been supplied by manufacturers in an unpackaged or bare configuration. Chip scale packages have also been developed with an outline that is substantially equivalent to a bare die. As with conventionally packaged dice, chip scale packages and bare dice must be tested following manufacture to certify quality and reliability. The dice can be evaluated for speed and functionality. In addition, burn-in testing can be conducted at elevated temperatures. These testing requirements have led to the development of test carriers that hold a single die for burn-in and other tests. Exemplary test carriers are disclosed in U.S. Pat. Nos. 5,302,891; 5,408,190; 5,495,179 and 5,519,332 to Wood et al.

This type of test carrier includes external leads adapted to electrically connect to test circuitry via a burn-in board or other electrical receptacle. In addition, an interconnect component of the test carrier provides a temporary electrical connection between the bond pads on the die and external leads on the carrier. In the assembled carrier, a force distribution mechanism biases the device under test (DUT) against the interconnect.

In order to accommodate volume semiconductor manufacture and the large number of different types of dice, these carriers need to be inexpensive to manufacture. In addition, in order to provide reliable testing for the dice, the electrical characteristics of the carriers must be within acceptable values. Important electrical characteristics for carriers include the inductance, resistance and capacitance of the conductive paths through the carrier to the DUT.

Typically the carriers include conductors in electrical communication with the external leads for the carriers. These conductors can be formed of a highly conductive metal deposited on a surface of the carrier base or formed internally within the carrier base. The interconnect also includes conductors in electrical communication with contact members that electrically connect with the bond pads on the die.

The electrical path between the conductors on the carrier and the conductors on the interconnect can be a wire bond or a mechanical electrical connection such as clips. It is desirable to minimize the length of this electrical path in order reduce parasitic induction and cross coupling of the test signals applied to the die. In addition, it is desirable that this electrical path be low resistance and reliable even with long term handling of the carrier in a production environment. For example, with an electrical path formed by wire bonding, the placement and integrity of the bond sites during their formation and continued usage can be a factor in the electrical performance of the carrier.

The present invention is directed to a carrier that does not include external leads and conductors on the carrier base. Rather the carrier includes an interconnect formed on the carrier base and adapted for direct electrical connection to external test circuitry. In addition, the present invention is directed to an improved method for fabricating a carrier with a direct connect interconnect.

SUMMARY OF THE INVENTION

In accordance with the present invention, an improved carrier and system for testing semiconductor dice including bare dice and chip scale packages and a method for fabricating the carrier are provided. The carrier includes a base formed of molded plastic or ceramic. In addition, the carrier includes an interconnect formed on the base and adapted for direct electrical connection to a testing apparatus such as a socket on a burn-in board. In a first embodiment, the interconnect includes a silicon substrate and raised contact members formed on the substrate using an etching process. In a second embodiment, the interconnect includes microbump contact members and associated conductors formed on a flexible tape similar two layer TAB tape.

A force applying mechanism attaches to the base and retains the die on the base in electrical communication with the interconnect. The force applying mechanism includes a clamp member that attaches to the base and a spring member that presses the die against the interconnect. In addition, a vacuum opening can be formed through the carrier base and interconnect to permit use of a vacuum in assembling and disassembling the carrier.

The interconnect includes a pattern of contact members adapted to make temporary electrical contact with test pads on the die. Each contact member includes a conductive layer for contacting the test pads on the die and an associated conductor formed on the substrate in electrical communication with an input/output pad. The input/output pads are configured for direct electrical contact with electrical members such as spring contacts of the testing apparatus. The conductive layer, conductors and input/output pads can be formed as a single layer of material or as a bi-metal stack. The single layer can comprise a hard inert metal such as palladium, tungsten, platinum or alloys thereof. The bi-metal stack can comprise a base layer formed of a highly conductive material such as copper or aluminum and an outer layer formed of a hard inert metal as specified above.

DETAILED DESCRIPTION OF THE PREFERRED EMBODIMENT

Figure 1:
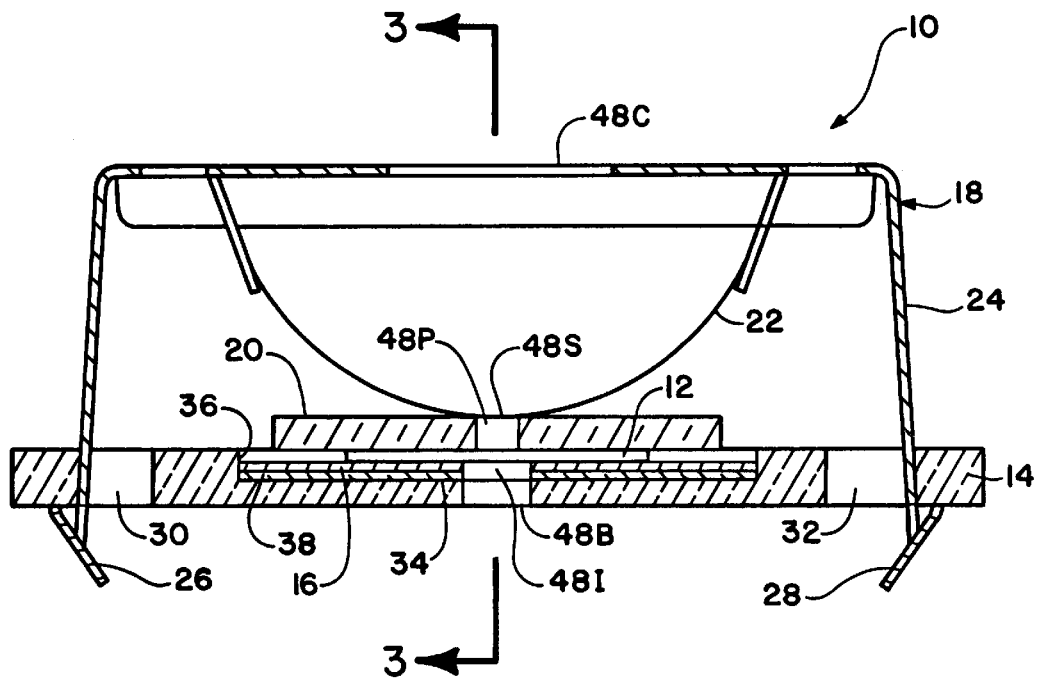
FIG. 1 is a cross sectional view of a carrier constructed in accordance with the invention.

Referring to FIG. 1, a carrier 10 constructed in accordance with the invention is shown. The carrier 10 is adapted to establish temporary electrical communication with a semiconductor die 12 for testing or other purposes. In the illustrative embodiment the die 12 is a bare or unpackaged semiconductor die. A bare die does not include a conventional plastic or ceramic package. However, it is to be understood that the carrier 10 is also suitable for testing a chip scale semiconductor package. Chip scale semiconductor packages can include thin protective covers formed of glass or other materials bonded to the face and backside of a bare die. An outline of a chip scale package is substantially equivalent to that of the bare die.

The carrier 10 includes a carrier base 14, an interconnect 16 and a force applying mechanism 18. The force applying mechanism 18 secures the die 12 to the base 14 and presses the die 12 against the interconnect 16. The force applying mechanism 18 includes a pressure plate 20, a spring 22 and a clamp member 24. The force applying mechanism 18 also includes a latching mechanism in the form of clips 26, 28 on the clamp member 24 which secure the force applying mechanism 18 to the base 14. The clips 26, 28 attach to corresponding openings 30, 32 formed in the base 14.

The clamp member 24, the spring 22, and the pressure plate 20 of the force applying mechanism 18 all include a central opening which are designated 48C, 48S and 48P respectively. The openings 48C, 48S and 48P can be used during assembly of the carrier 10 to permit the die 12 to be held by a vacuum tool (not shown) during optical alignment of the die 12 and interconnect 16. In a similar manner, a vacuum tool (not shown) can be used to disassemble the carrier 10.

In addition, an opening 48B can be formed in the base 14 and an opening 48I can be formed in the interconnect. The openings 48B and 48I permit access to the die 12 for assembly and disassembly. The openings 48B and 48I can be used as vacuum conduits for holding and manipulating the die 12 using a vacuum force during assembly and disassembly of the carrier 10. For example, during attachment of the force applying mechanism 18 to the base 14 a vacuum can be directed through openings 48B and 48I to hold the die 12 in place.

Figure 2:
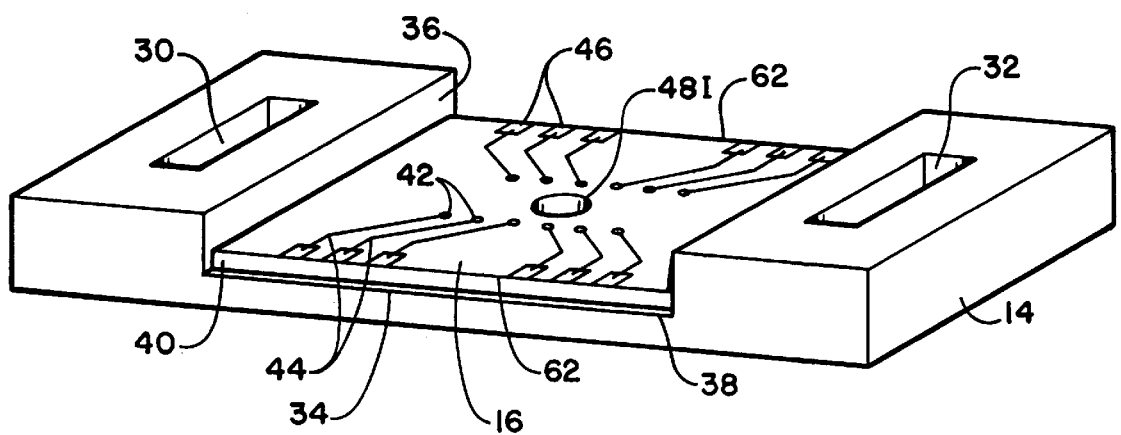
FIG. 2 is a perspective view of a carrier base and interconnect for the carrier.

Referring to FIG. 2, the carrier base 14 also includes a recess 36 having a support surface 34 wherein the interconnect 16 is formed or mounted. The interconnect 16 can be formed separately and attached to the support surface 34 using an adhesive layer 38. The adhesive layer 38 can be an insulating adhesive, such as an epoxy or a deposited polymer, such as polyimide.

The interconnect 16 includes a substrate 40 and a pattern of contact members 42 formed thereon. The interconnect 16 also includes a pattern of conductors 44 associated with the contact members 42. The conductors 44 extend to the edges 62 of the interconnect 16 and include input/output pads 46 at a terminal portion. The interconnect 16 can have a peripheral shape just large enough to test a particular size and type of die 12. The base 14 can have a corresponding peripheral shape but slightly larger along the sides to accommodate attachment of the force applying mechanism. This arrangement permits the base 14 to have a relatively small outline or footprint.

Figure 4:
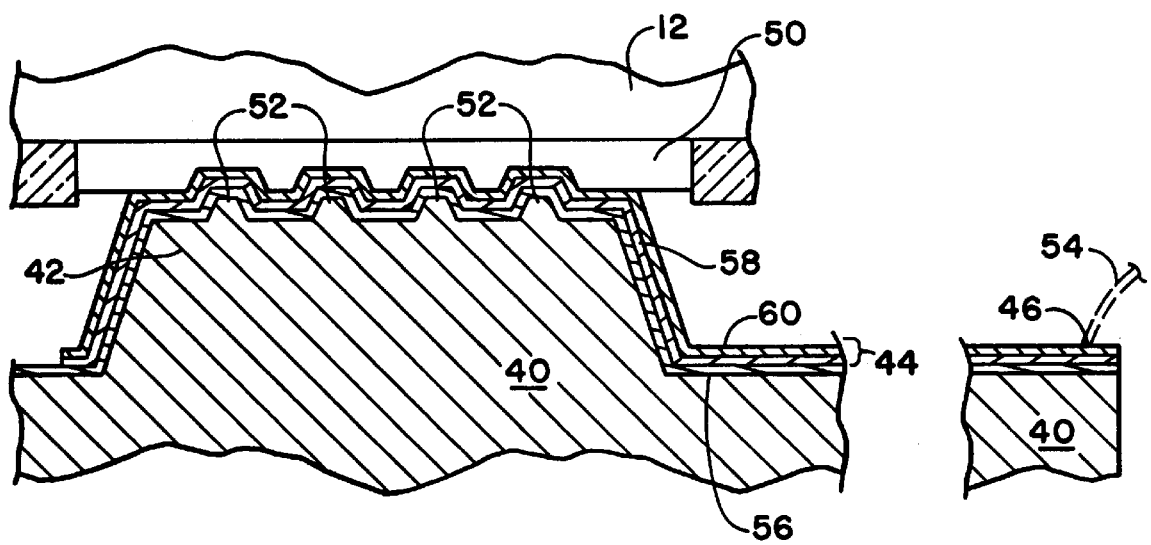
FIG. 4 is an enlarged cross sectional view taken along section line 4—4 of FIG. 3 illustrating a contact member for the interconnect in temporary electrical contact with test pads on the die.

The contact members 42 are formed in a pattern that corresponds to test pads 50 (FIG. 4) on the die 12. The test pads 50 can be the die bond pads which are typically formed of a thin layer of aluminum. The test pads 50 can also be solder bumps (not shown) for bumped dice. In addition, the test pads 50 can be other contact areas formed on the die 12 specifically for testing. As shown in FIG. 4, the contact members 42 are adapted to penetrate the test pads 50 to establish temporary electrical connections for testing the integrated circuits formed on the die 12 in electrical communication with the test pads 50.

During assembly of the carrier 10, the contact members 42 on the interconnect 16 can be aligned with the test pads 50 on the die 12 using optical alignment techniques. One suitable technique utilizes an aligner bonder tool used for flip chip bonding semiconductor dice. An aligner bonder and method of optical alignment for flip chip bonding are described in U.S. Pat. No. 4,899,921 to Bendat et al, entitled "Aligner Bonder". Such an aligner bonder is available from Research Devices of Piscataway, N.J.

U.S. Pat. No. 5,634,267, incorporated herein by reference, describes an automated apparatus suitable for optically aligning the die 12 and interconnect 16 and securing the force applying mechanism 18 to the carrier base 14. With this type of alignment device, the die 12 and base 14 are mounted on adjustable supports (not shown) that are movable in the x, y and z directions, in a rotational direction (theta) and in angles of inclination. An optical probe (not shown) associated with the adjustable supports views the surfaces of the die 12 and interconnect 16 and forms an image on a video screen (not shown). By moving the adjustable supports as required, the test pads 50 on the die 12 can be aligned with the contact members 42 on the interconnect 16 and the aligned members brought into contact.

Figure 3:
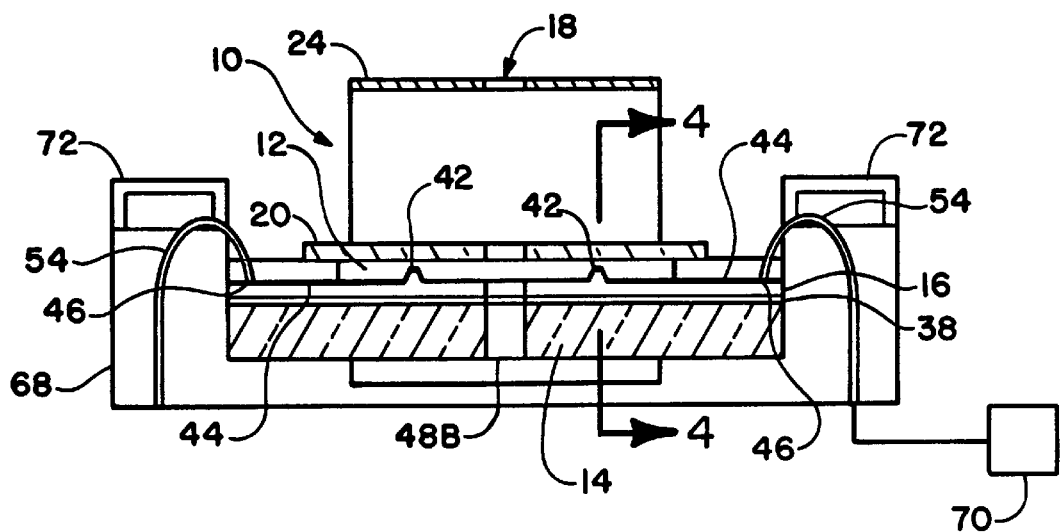
FIG. 3 is a schematic cross sectional view of the carrier and a testing apparatus taken along section line 3—3 of FIG. 2.

Following the alignment and assembly procedure, the carrier 10 can be used to test the die 12. Testing can include full functionality as well as burn-in testing. Referring to FIG. 3, a system for testing the die 12 using the assembled carrier 10 is shown. The assembled carrier 10 is designed to be placed in a testing apparatus 68 such as a test socket on a burn-in board. The testing apparatus 68 is in electrical communication with test circuitry 70. The test circuitry 70 is adapted to generate and receive test signals for testing the die 12.

The testing apparatus 68 can include electrical members 54 in electrical communication with the test circuitry 70. For example, the electrical members 54 can be spring type contacts that can be mechanically biased by a slide mechanism 72 into engagement with the input/output pads 46 on the conductors 44 for the interconnect 16. A direct electrical connection is thus provided to the contact members 42 of the interconnect 16 rather than through the carrier base 14. This direct electrical path improves the testing procedure because the electrical path to the die 12 has lower inductance, resistance and capacitance.

Referring to FIG. 4, a contact member 42 on the interconnect 16 is illustrated in electrical communication with a test pad 50 on the die 12. Each contact member 42 includes a plurality of penetrating projections 52 adapted to penetrate into the test pad 50 on the die 12 to a self limiting penetration depth.

As will be further explained, the contact member 42 and penetrating projections 52 can be formed by etching the silicon substrate 40 of the interconnect 16. The interconnect 16 also includes an insulating layer 56 formed over the entire surface of the substrate 40 including over the contact members 42. The conductors 44 are formed on top of the insulating layer 56. In the embodiment illustrated in FIG. 4, the conductors 44 are formed as a bi-metal stack. However the conductors 44 can also be formed of a single layer of material.

With a bi-metal stack a base layer 58 for the conductors 44 is formed of a highly conductive metal such as aluminum, copper, gold or tungsten. A contact layer 60 for the conductors 44 is formed of a metal that will not react with or form a permanent bond with the test pads 50 on the die 12. In addition, the contact layer 60 is formed of a metal that will provide a wear resistant "touch surface" for contacting the test pads 50 and for being contacted by the electrical members 54. Suitable metals for the contact layer 60 include palladium, tungsten and platinum and alloys of these metals. The contact layer 60 can also be formed as a metal silicide such as $TiSi_2$.

Referring to FIGS. 5A–5D, a process for forming the interconnect 16 with the contact members 42, bi-metal conductors 44 and bi-metal input/output pads 46 is shown. In FIGS. 5A–5D, the edge 62 of the interconnect 16 wherein the input/output pads 46 will be formed is depicted on the right.

Figure 5A:
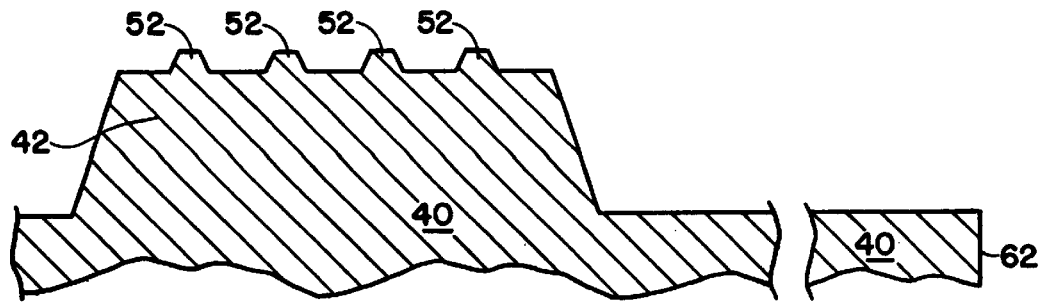
FIGS. 5A–5D are schematic cross sectional views illustrating a process for forming the interconnect for the carrier.

Initially, as shown in FIG. 5A, the penetrating projections 52 can be formed by forming a mask (not shown) on the substrate 40 and then etching the substrate 40 through the mask. For example, a hard mask can be formed on the substrate 40 by depositing a layer of silicon nitride ($Si_3N_4$) and then patterning the silicon nitride layer using hot phosphoric acid. A wet or dry, isotropic or anisotropic, etch process can then be used to etch through openings in the hard mask to form the penetrating projections 52. For example, an anisotropic etch can be performed on the silicon substrate 40 using a solution of KOH and $H_2O$.

The penetrating projections 52 are elongated blades formed in locations that match the placement of the test pads 50 (FIG. 4) on the die 12. In the illustrative embodiment there are four penetrating projections 52 per contact member 42. However, a greater or lesser number can be formed. In addition, the penetrating projections 52 for each contact member 42 are formed in a pattern having an outline contained within the perimeter of the test pads 50 on the die. A height of the penetrating projections 52 is selected to be less than a thickness of the test pads 50. A representative height for the penetrating projections 52 measured from the base to the tip of the contact member 42 can be from 0.2 to 1 μm. A representative length measured from end to end of the projections 52 can be from 3 to 100 μm.

Once the penetrating projections 52 are formed, the hard mask can be stripped and another mask (not shown) can be formed for etching the substrate 40 to form the contact members 42. With an anisotropic etch process the contact members 42 are formed as topographically elevated pillars having a generally conical configuration. A representative height of the contact member 42 from base to tip can be from 50–100 μm. A representative width of each side of the contact member 42 can be from 40–80 μm. Following the etch process to form the contact members 42 the etch mask can be stripped.

Suitable etch processes for forming the contact member 42 and penetrating projections 52 substantially as shown in FIG. 5A, are also disclosed in U.S. Pat. Nos. 5,326,428; 5,419,807 and 5,483,741 which are incorporated herein by reference.

Figure 5B:
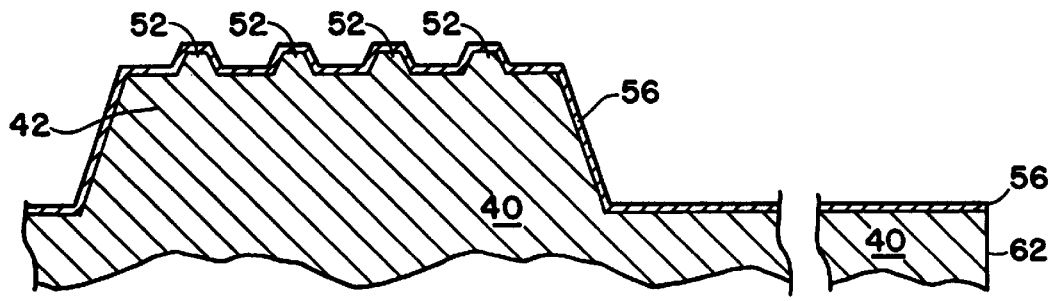

Referring to FIG. 5B, once the penetrating projections 52 and contact members 42 are formed, the insulating layer 56 can be formed over the entire substrate 40. The insulating layer 56 can be a grown or deposited material such as $SiO_2$ or $Si_3N_4$. A representative thickness for the insulating layer 56 can be from 500 Å to 1 μm.

Figure 5C:
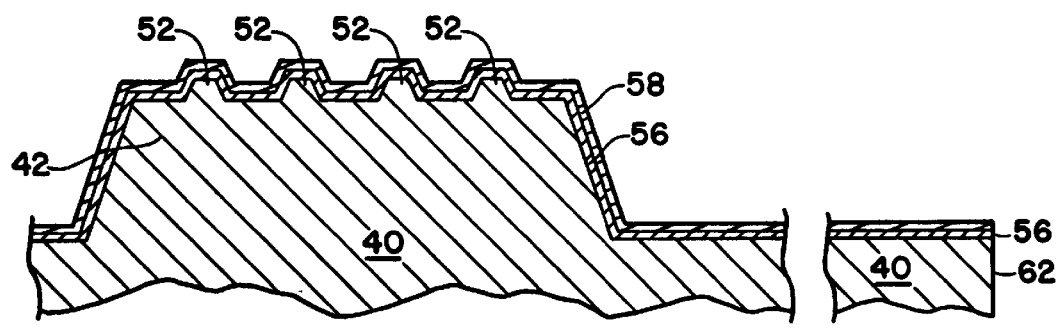

Next as shown in FIG. 5C, the base layer 58 is formed on the insulating layer. To form the base layer 58 a metal such as aluminum, copper, gold, tungsten or alloys thereof, can be blanket deposited on the substrate 40 by sputtering or other deposition process. A representative thickness for the base layer 58 can be from 500 Å to 2 μm.

Following blanket deposition, the base layer 58 can be covered with resist and exposed in areas where the contact members 42, the conductors 44, and the input/output pads 46 for the conductors 44 are to be located. Development of the resist forms a mask with the areas where the contact members 42, conductors 44 and input/output pads 46 will be formed being exposed.

Figure 5D:
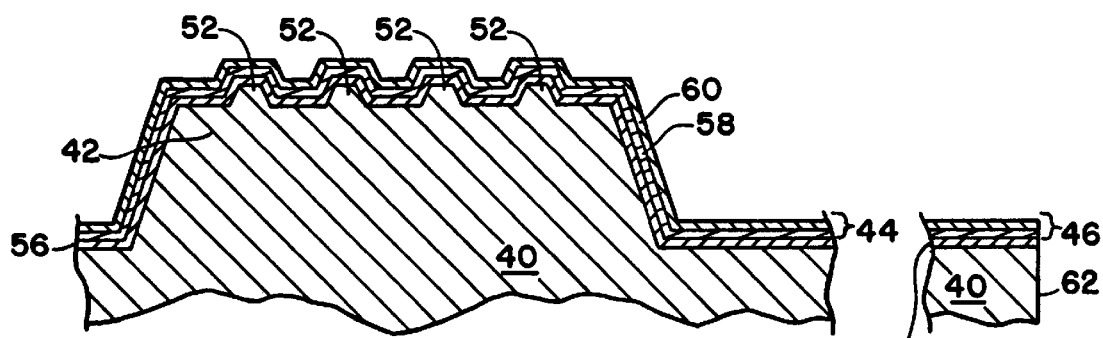

Next, as shown in FIG. 5D, the contact layer 60 can be formed on the exposed portions of the base layer 58. A preferred method of forming the contact layer 60 is by electroless plating of an inert metal such as palladium, tungsten or platinum. With electroless plating, an aqueous solution comprising metal ions and reducing agents is used. Compositions for these solutions for different metals are known in the art. In the present case, the entire interconnect 16 is submerged in the solution. The exposed portions of the base layer 58 wherein the contact members 42, conductors 44 and input/output pads 46 for the conductors 44 will be formed are plated with the contact layer 58 during the electroless deposition process. A representative thickness for the contact layer 60 can be from 200 Å to 2 μm. Following electroless plating of the contact layer 60 the portions of the base layer 58 not plated can be removed using a suitable etchant that etches the base layer 58 selective to the contact layer 60. During this etch step the contact layer 60 can function as an etch mask. This electroless deposition process forms the contact members 42, the conductors 44 and the input/output pads 46 as bi-metal stacks.

As an alternative to the above outlined process wherein the portions of the base layer 58 not plated are etched away, the contact layer 60 can be electrolessly deposited on the etched pattern for the conductors 44 and input/output pads 46. In this case, a layer of photoresist is blanket deposited, exposed and developed to form a resist mask. The pattern for the conductors 44 and input/output pads 46 can be etched using the resist mask. Upon stripping of the resist mask, an electroless deposition process can be used to plate the contact layer 60 to the exposed metal that remains after the etch process.

As another alternative, the conductors 44 and input/output pads 46 can be formed as a single layer of material rather than a bi-metal stack. In this case the contact members 40 and insulating layer 46 can be formed as shown in FIGS. 5A and 5B. Next, a single layer of an inert, wear resistant metal such as palladium, tungsten, platinum or alloys thereof can be blanket deposited over the substrate 40 and contact members 42. The single layer of metal can be deposited by sputtering or chemical vapor deposition. The single layer of metal will be substantially equivalent to the base layer 58 shown in FIG. 5C. Next the single layer of metal (58-FIG. 5C) can be coated with a layer of resist. Although the layer of resist can be deposited by conventional methods, a preferred method of depositing the layer of resist is by electrophoretic deposition. This deposition process permits a thin uniform layer to be deposited on the raised contact members 42 (FIG.-5B) substantially without sliding from the sidewalls of the contact members 42 and pooling.

With an electrophoretic deposition process the substrate 40 is submerged in an emulsion containing photoresist and a non-sacrificial electrode. The blanket deposited layer of metal (58-FIG. 5C) and the non-sacrificial electrode are electrically biased by a voltage source. The photoresist emulsion includes a polymer having a photo initiator and a source of unsaturation for initiating a cross linking reaction. In addition, the photoresist solution includes a carrier group that becomes positively or negatively charged upon contact with either an acid or a base. Depending on the composition of the carrier group and the bias applied by the voltage source, the carrier group causes the photoresist to coat onto the blanket deposited layer (58-FIG. 5C). Process parameters such as voltage, current, photoresist composition, temperature and electrode size and spacing can be controlled to deposit a thin uniform layer of photoresist on the blanket deposited layer of metal (58-FIG. 5C) including over the sidewalls and tip portions of the contact members 40. The electrophoretic deposition process is self limiting in that the photoresist will deposit to a certain thickness and then endpoint without further deposition.

The electrophoretically deposited layer of photoresist can then be exposed and developed to form a mask for etching the blanket deposited layer of metal (58-FIG. 5C) to form single layer conductors (44-FIG. 5D) and input/output pads (46-FIG. 5D). A suitable electrophoretic deposition process as described above is disclosed in U.S. Pat. No. 5,607,818, incorporated herein by reference.

Figure 6A:
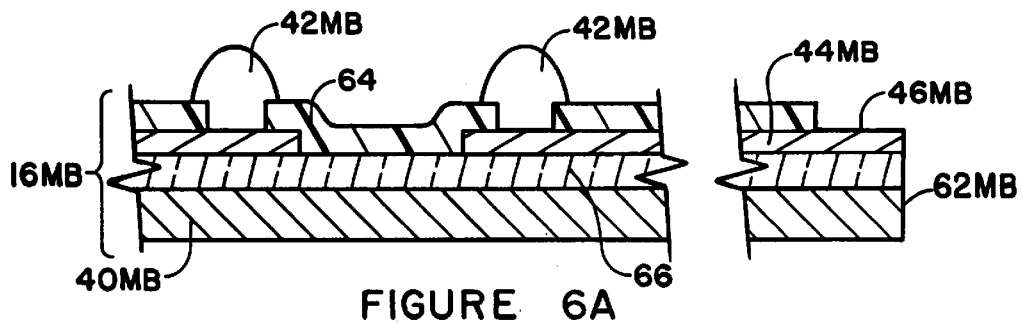
FIGS. 6A–6B are schematic cross sectional views illustrating a process for forming an alternate embodiment interconnect with microbump contact members.
Figure 6B:
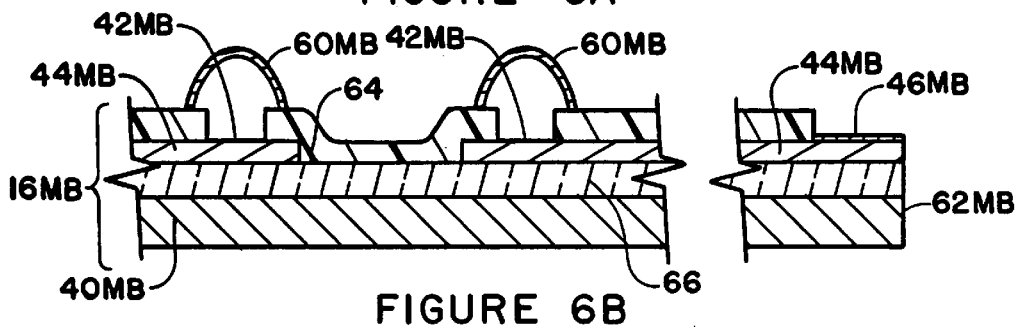

Referring to FIGS. 6A–6B, a process for forming an alternate embodiment microbump interconnect 16MB is shown. The microbump interconnect 16MB functions with the carrier 10 in the same manner as the interconnect 16 previously described. The microbump interconnect 16MB includes a substrate 40MB formed of a rigid material such as silicon, ceramic, FR-4 or plastic. In addition, the microbump interconnect 16MB includes an insulating film 64 formed of a flexible material, such as polyimide, and a pattern of conductors 44MB formed on the insulating film 64.

Microbump contact members 42MB are formed in vias through the insulating film 64 in electrical communication with the conductors 44MB. The microbump contact members 42MB can be an electroplated metal such as nickel, gold or copper. A representative diameter for the microbump contact members 42MB is from 15–100 $\mu$m depending on the size of the test pads 50 on the die 12. A spacing for the microbump contact members 42MB will also depend on the spacing of the test pads 50 but can be from 25–250 $\mu$m or greater.

The microbump conductors 44MB can be a highly conductive metal such as patterned copper foil laminated to the insulating film 64. The microbump contact members 42MB and conductors 44MB function substantially similar to the contact members 42 and conductors 44 previously described.

The insulating film 64, microbump contact members 42MB and conductors 44MB can be formed of two layer TAB tape such as ASMAT$_{TM}$ manufactured by Nitto Denko, Inc. This type of TAB tape can be manufactured separately and then attached to the substrate 40MB using a compliant adhesive layer 66. In addition, the insulating film 64 can be removed in areas along the edges 62MB of the interconnect 16MB wherein the input/output pads 46MB will be located. The insulating film 64 can be removed in these areas using a suitable patterning and etching process. The input/output pads 46MB function substantially similar to the input/output pads 46 previously described.

A suitable process for attaching two layer TAB tape to a substrate to form the microbump interconnect 16MB substantially as shown in FIG. 6A, is disclosed in U.S. Pat. No. 5,678,301, incorporated herein by reference.

Referring to FIG. 6B, following formation of the microbump interconnect 16MB to the configuration shown in FIG. 6A, a contact layer 60MB can be formed on the microbump contact members 42MB and on the input/output pads 46MB. The contact layer 60MB can be formed of an inert metal such as palladium deposited using an electroless plating process as previously described. In this case, the contact layer 42MB deposits on the microbump contact members 42MB and on the exposed input/output pads 46MB. A representative thickness for the electroless deposited contact layer 42MB can be from 200 Å to 2 $\mu$m.

Figure 7:
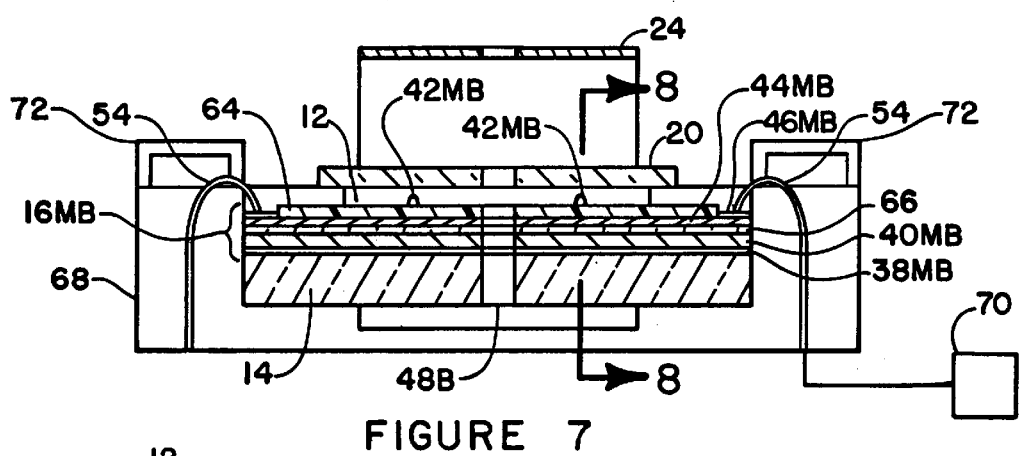
FIG. 7 is a schematic cross sectional view equivalent to FIG. 3 illustrating the alternate embodiment interconnect and a testing apparatus.

Referring to FIG. 7, following its formation the microbump interconnect 16MB can be attached to the carrier base 14 using an adhesive layer 38MB. The adhesive layer 38MB can be an insulating adhesive or a deposited polymer such as polyimide, substantially as previously described for adhesive layer 38. During testing of the die 12 using the microbump interconnect 16MB, the electrical members 54 on the testing apparatus 68 contact the input/output pads 46MB. A direct electrical path is thus provided from external test circuitry to the microbump interconnect 16MB.

Figure 8:
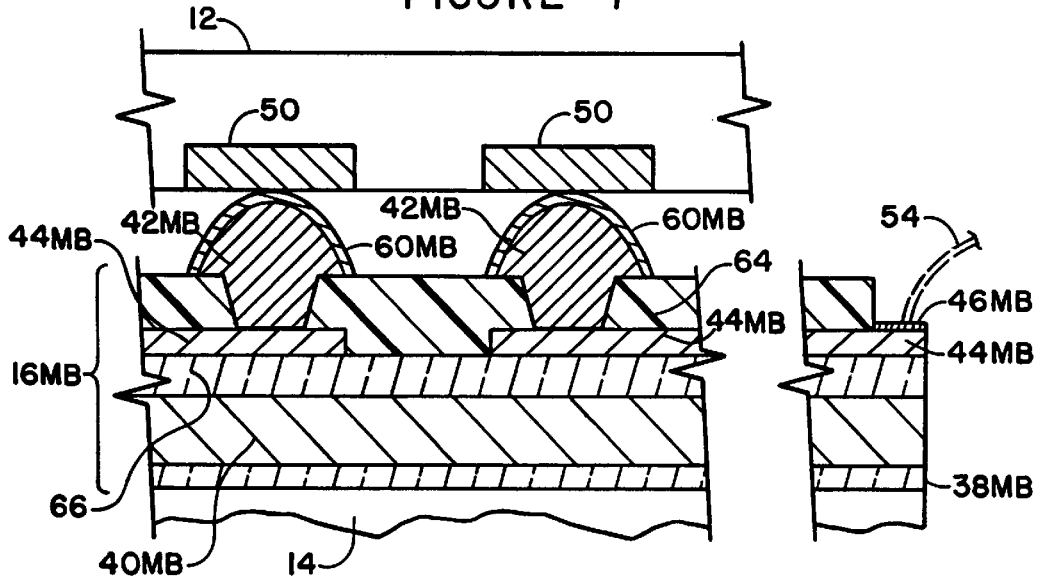
FIG. 8 is an enlarged cross section view taken along section line 8—8 of FIG. 7 illustrating contact members for the alternate embodiment interconnect in temporary electrical contact with test pads on the die.

Referring to FIG. 8, the electrical connection between the microbump contact members 42MB and the test pads 50 on the die 12 is illustrated. In this case the electrical path is from the electrical members 54, through the input/output pads 46MB, through the conductors 44MB, through the microbump contact members 42MB and to the test pads 50 on the die 12.

Thus the invention provides an improved carrier and an improved system for testing semiconductor dice. The carrier is characterized by a direct electrical path from external test circuitry to the contact members that establish temporary electrical communication with the die. While the invention has been described with reference to certain preferred embodiments, as will be apparent to those skilled in the art, certain changes and modifications can be made without departing from the scope of the invention as defined by the following claims.

What is claimed is:

1. A system for testing a semiconductor die, comprising:
   a base configured to retain the die;
   an interconnect on the base comprising a substrate, a plurality of first contacts on the substrate configured to electrically contact a plurality of second contacts on the die, and a plurality of input/output pads on the substrate in electrical communication with the first contacts, the first contacts and the input/output pads comprising wear resistant contact layers; and
   a socket configured to receive the base comprising a plurality of electrical members in electrical communication with test circuitry, and configured to mechanically and electrically engage the input/output pads with the interconnect on the base, to provide a plurality of electrical paths for applying test signals directly from the electrical members to the input/output pads, without an electrical connection on the base.

2. The system of claim 1 wherein the wear resistant contact layers comprise a material selected from the group consisting of palladium, tungsten, platinum, alloys of palladium, alloys of tungsten, and alloys of platinum.

3. The system of claim 1 the wear resistant contact layers comprise a metal silicide.

4. The system of claim 1 further comprising a polymer layer attaching the interconnect to the base.

5. The system of claim 1 wherein the die comprises a chip scale package.

6. A system for testing a semiconductor die, comprising:
a base configured to retain the die;
an interconnect on the base comprising a substrate, a tape attached to the substrate, a plurality of microbump contacts on the tape configured to electrically contact pads on the die, and a plurality of input/output pads on the tape in electrical communication with the microbump contacts, the microbump contacts and the input/output pads comprising wear resistant contact layers; and
a socket configured to receive the base comprising a plurality of electrical members in electrical communication with test circuitry, and configured to mechanically and electrically engage the input/output pads with the interconnect on the base, to provide a plurality of electrical paths for applying test signals directly from the electrical members to the input/output pads, without an electrical connection on the base.

7. The system of claim 6 wherein the socket comprises a mechanism for mechanically biasing the electrical members into engagement with the input/output pads.

8. The system of claim 6 wherein the die comprises a chip scale package.

9. The system of claim 6 further comprising a polymer layer attaching the interconnect to the base.

10. The system of claim 6 wherein the electrical members comprise spring contacts and the socket comprises a mechanism for mechanically biasing the electrical members into engagement with the input/output pads.

11. The system of claim 10 wherein the contact layers comprise a material selected from the group consisting of metal silicide, palladium, tungsten, platinum, alloys of palladium, alloys of tungsten, and alloys of platinum.

12. A system for testing a semiconductor die comprising:
a carrier configured to hold the die, the carrier comprising a base, an interconnect on the base comprising a substrate, a first contact on the substrate configured to establish temporary electrical communication with a second contact on the die, and an input/output pad on the substrate in electrical communication with the first contact, the first contact and the input/output sad comprising a contact layer comprising a material selected from the group consisting of metal silicide, palladium, tungsten, platinum, alloys of palladium, alloys of tungsten, and alloys of platinum; and
a testing apparatus comprising a socket configured to receive the carrier and an electrical member on the socket in electrical communication with test circuitry, the electrical member comprising a spring contact configured to mechanically and electrically engage the input/output pad with the interconnect on the base, to provide an electrical path for applying test signals directly from the electrical member to the input/output pad, without an electrical connection on the base.

13. The system of claim 12 wherein the die comprises a chip scale package.

14. The system of claim 12 wherein the socket comprises a mechanism for mechanically biasing the electrical member into engagement with the input/output pad.

15. A system for testing a chip scale package comprising:
a carrier configured to hold the chip scale package, the carrier comprising a base for retaining the package, an interconnect on the base comprising a substrate, a first contact on the substrate configured to establish temporary electrical communication with a second contact on the package, and an input/output pad on the substrate in electrical communication with the first contact, the first contact and the input/output pad comprising a contact layer comprising a material selected from the group consisting of metal silicide, palladium, tungsten, platinum, alloys of palladium, alloys of tungsten, and alloys of platinum; and
a testing apparatus comprising a socket configured to receive the carrier and an electrical member on the socket in electrical communication with test circuitry, the electrical member comprising a spring contact configured to mechanically and electrically engage the input/output pad with the interconnect on the base, to provide an electrical path for applying test signals directly from the electrical member to the input/output pad, without an electrical connection on the base.

16. The system of claim 15 wherein the socket comprises a mechanism for mechanically biasing the electrical member into engagement with the input/output pad.

17. The system of claim 15 further comprising a polymer layer attaching the interconnect to the base.

18. A method for testing a semiconductor die, comprising:
providing a carrier comprising a base and a force applying mechanism configured to hold the die on the base;
providing a socket configured to receive the carrier, the socket comprising a spring contact in electrical communication with test circuitry;
attaching an interconnect to the base, the interconnect comprising a substrate, a first contact on the substrate, and an input/output pad on the substrate in electrical communication with the first contact, the first contact and the input/output pad comprising a wear resistant contact layer;
assembling the carrier with a second contact on the die in electrical contact with the first contact; and
placing the spring contact in mechanical and electrical engagement with the input/output pad with the interconnect on the base, to provide an electrical path for applying test signals directly from the spring contact to the input/output pad, without an electrical connection on the base.

19. The method of claim 18 wherein the attaching step comprises forming a polymer layer between the interconnect and the base.

20. The method of claim 18 further comprising mechanically biasing the spring contact into engagement with the input/output pad using a mechanism on the socket.

21. The method of claim 18 wherein the substrate comprises silicon and the first contact comprises an etched member at least partially covered by the contact layer.

22. The method of claim 18 wherein the first contact comprises a microbump on an electrically insulating tape attached to the substrate and at least partially covered by the contact layer.

23. A method for testing a chip scale package comprising:
providing a carrier comprising a base and a force applying mechanism configured to hold the chip scale package on the base;
providing a socket configured to receive the carrier, the socket comprising a spring contact in electrical communication with test circuitry;

attaching an interconnect to the base using a polymer layer, the interconnect comprising a substrate, a first contact on the substrate, and an input/output pad on the substrate in electrical communication with the first contact, the first contact and the input/output pad comprising a contact layer comprising a material selected from the group consisting of metal silicide, palladium, tungsten, platinum, alloys of palladium, alloys of tungsten, and alloys of platinum;

assembling the chip scale package in the carrier with a second contact on the chip scale package in electrical contact with the first contact; and placing the spring contact in mechanical and electrical engagement with the input/output pad on the interconnect to provide an electrical path for applying test signals directly from the spring contact to the input/output pad, without an electrical connection on the base.

24. The method of claim 23 further comprising mechanically biasing the spring contact into engagement with the input/output pad using a mechanism on the socket.

* * * * *